United States Patent
Thacker

(10) Patent No.: US 9,287,879 B2
(45) Date of Patent: Mar. 15, 2016

(54) SEMICONDUCTOR DEVICE HAVING FEATURES TO PREVENT REVERSE ENGINEERING

(71) Applicant: Verisiti, Inc., Sanford, NC (US)

(72) Inventor: William Eli Thacker, Sanford, NC (US)

(73) Assignee: Verisiti, Inc., Sanford, NC (US)

( * ) Notice: Subject to any disclaimer, the term of this patent is extended or adjusted under 35 U.S.C. 154(b) by 459 days.

(21) Appl. No.: 13/663,921

(22) Filed: Oct. 30, 2012

(65) Prior Publication Data

US 2013/0154687 A1 Jun. 20, 2013

Related U.S. Application Data

(63) Continuation of application No. 13/194,452, filed on Jul. 29, 2011, now abandoned.

(60) Provisional application No. 61/494,172, filed on Jun. 7, 2011.

(51) Int. Cl.
| | |
|---|---|
| *H03K 19/20* | (2006.01) |
| *H01L 21/82* | (2006.01) |
| *H01L 23/00* | (2006.01) |
| *H01L 27/02* | (2006.01) |
| *H01L 27/06* | (2006.01) |
| *H01L 49/02* | (2006.01) |

(52) U.S. Cl.
CPC ............... *H03K 19/20* (2013.01); *H01L 21/82* (2013.01); *H01L 23/573* (2013.01); *H01L 27/0203* (2013.01); *H01L 27/06* (2013.01); *H01L 28/24* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 4,376,947 | A * | 3/1983 | Chiu | G11C 16/0416 257/316 |
| 4,583,011 | A * | 4/1986 | Pechar | 326/8 |
| 4,933,898 | A | 6/1990 | Gilberg et al. | |
| 5,783,846 | A | 7/1998 | Baukus et al. | |
| 5,923,212 | A * | 7/1999 | Womack | 327/541 |
| 5,999,019 | A * | 12/1999 | Zheng | H03K 19/0963 326/17 |
| 6,117,762 | A | 9/2000 | Baukus et al. | |
| 6,897,535 | B2 | 5/2005 | Chow et al. | |
| 7,049,667 | B2 | 5/2006 | Chow et al. | |
| 7,115,460 | B2 * | 10/2006 | Shaw et al. | 438/213 |
| 7,128,271 | B2 | 10/2006 | Kim | |
| 7,166,515 | B2 | 1/2007 | Clark, Jr. et al. | |
| 7,262,457 | B2 * | 8/2007 | Hsu | G11C 16/0433 257/261 |
| 7,711,964 | B2 | 5/2010 | Van Essen et al. | |

(Continued)

OTHER PUBLICATIONS

Li et al., 2006, Analysis of Failure Mechanism on Gate-Silicided and Gate-Non-Silicided, Drain/Source Silicide-blocked ESD NMOSFETs in a 65nm Bulk CMOS Technology, IEEE Proceedings of 13th IPFA 2006, Singapore.*

*Primary Examiner* — Alexander H Taningco
*Assistant Examiner* — Nelson Correa

(57) ABSTRACT

It is desirable to design and manufacture electronic chips that are resistant to modern reverse engineering techniques. Disclosed is a method and device that allows for the design of chips that are difficult to reverse engineer using modern teardown techniques. The disclosed device uses devices having the same geometry but different voltage levels to create different logic devices. Alternatively, the disclosed uses devices having different geometries and the same operating characteristics. Also disclosed is a method of designing a chip using these devices.

4 Claims, 14 Drawing Sheets

(56) References Cited

U.S. PATENT DOCUMENTS

| | | | |
|---|---|---|---|
| 8,111,089 B2* | 2/2012 | Cocchi | H03K 19/20 326/113 |
| 2002/0096744 A1 | 7/2002 | Chow et al. | |
| 2002/0096776 A1 | 7/2002 | Chow et al. | |
| 2003/0034909 A1* | 2/2003 | Wong | H04K 1/00 341/155 |
| 2003/0048666 A1* | 3/2003 | Eldridge | H01L 27/115 365/185.28 |
| 2004/0061186 A1 | 4/2004 | Chow et al. | |
| 2005/0280083 A1* | 12/2005 | Vogelsang | 257/338 |
| 2006/0166457 A1* | 7/2006 | Liu et al. | 438/400 |
| 2007/0243675 A1 | 10/2007 | Chow et al. | |
| 2007/0290253 A1* | 12/2007 | Kito et al. | 257/315 |
| 2008/0079082 A1 | 4/2008 | Clark et al. | |
| 2008/0295057 A1 | 11/2008 | Tsien et al. | |
| 2009/0111257 A1* | 4/2009 | Hsu et al. | 438/599 |
| 2009/0246355 A9 | 10/2009 | Lower et al. | |
| 2010/0078727 A1* | 4/2010 | Min et al. | 257/369 |
| 2010/0187525 A1 | 7/2010 | Bartley et al. | |
| 2010/0213974 A1 | 8/2010 | Chow et al. | |
| 2010/0218158 A1 | 8/2010 | Chow et al. | |
| 2010/0301903 A1 | 12/2010 | Cocchi et al. | |
| 2011/0085662 A1 | 4/2011 | Myers et al. | |
| 2012/0131533 A1 | 5/2012 | Marinet | |
| 2013/0320491 A1* | 12/2013 | Thacker et al. | 257/531 |
| 2014/0198554 A1* | 7/2014 | Thacker, III | G06F 21/75 365/104 |
| 2015/0071434 A1* | 3/2015 | Thacker, III | G03G 15/0863 380/30 |

* cited by examiner

PRIOR ART

SEMICONDUCTOR DEVICE HAVING FEATURES TO PREVENT REVERSE ENGINEERING

The present application is a divisional of U.S. patent application Ser. No. 13/194,452 filed on Jul. 29, 2011, which claims the benefit of U.S. Provisional Application Ser. No. 61/494,172 filed Jun. 7, 2011, which is incorporated by reference herein in its entirety.

BACKGROUND

It is desirable to design an electronic chip that is difficult to reverse engineer to protect the circuit design. Known reverse engineering techniques include methods for tearing down layers of the chip to expose the logic devices.

Semiconductor teardown techniques typically involve imaging a device layer, removing the layer, imaging the next layer, removing the layer, and so on until a complete representation of the semiconductor device is realized. Layer imaging is usually accomplished using an optical or electron microscope. Layer removal can be done by using physical means such as lapping or polishing, by chemical means by etching specific compounds, by using a laser or a focused ion beam technique (FIB), or by any other known method capable of removing the layers. FIG. 1 shows some of the semiconductor layers and regions that are imaged by the teardown reverse engineering technique.

Once, the semiconductor device teardown is complete and the imaging information is gathered, the logic function of the device can be re-constructed by using diffusion, polysilicon, and well areas to define the MOS devices used to create logic gates, and the metal layers to define how the logic gates are interconnected. FIG. 2 shows how the semiconductor layers define the MOS device.

U.S. Pat. No. 7,711,964 discloses one method of protecting logic configuration data. The configuration data for the logic device is encrypted and a decryption key is encrypted using a silicon key. The encrypted decryption key and configuration are transferred to the logic device. The silicon key is used to decrypt the decryption key which is then used to decrypt the configuration data. One problem with this method is that the chip is not protected against physical reverse engineering as described above.

Many other cryptography techniques are known. But, all cryptographic techniques are vulnerable to the conventional teardown techniques.

Disclosed is a method for designing a semiconductor device that is resistant to these techniques. The semiconductor device where the physical geometry is not clearly indicative of device's function. For example, the semiconductor device is designed where two or more types of logic devices have the same physical geometry. When the teardown method is performed two or more devices will show the same physical geometry, but, these two or more devices have different logic functions. This prevents the person performing the reverse engineering to determine the logic functions by the known methods of observing the geometry of the devices.

Employing the disclosed method and device will force the reverse engineer to employ more difficult techniques. These techniques are more time consuming, more expensive, and more likely to have errors.

SUMMARY

The present method and device presents a semiconductor device that it is difficult to reverse engineer using known techniques.

One device is an electronic element including a first device and a second device. The first device has a first geometry and a first characteristic and the second device has a second geometry and a second characteristic. The first geometry and the second geometry are the same and the second characteristic is different than the first characteristic. The electronic element may include additional devices. The devices may be active devices or they may be a silicided poly resistor and a non-silicided poly resistor.

A second device is an electronic circuit including a first logic device and a second logic device. At least one of the first logic device and the second logic device is comprised of a first device having a first geometry and a first characteristic, and a second device having a second geometry and a second characteristic. The first geometry and the second geometry are the same and the second characteristic is different than the first characteristic.

A method of manufacturing a semiconductor device that is resistant to reverse engineering is provided. The method includes providing one or more invisible bias generators having a first device having a first geometry and a first characteristic, and a second device having a second geometry and a second characteristic, wherein the first geometry and the second geometry are the same and the second characteristic is different than the first characteristic. Multiple logic devices are provided and one or more invisible bias generators are randomly distributed within the logic devices.

A method of designing a semiconductor device that is resistant to reverse engineering is provided. The method includes providing one or more invisible bias generators having a first device having a first geometry and a first bias voltage, and a second device having a second geometry and a second bias voltage, wherein the first geometry and the second geometry are the same and the second bias voltage is different than the first bias voltage. The method also includes providing multiple logic devices; and randomly distributing within the logic devices the one or more invisible bias generator.

Another method of manufacturing a semiconductor device that is resistant to reverse engineering is provided. The method includes providing a substrate, providing a first metal layer, wherein outputs for electronic devices are located on the first metal layer. The method also includes providing a second metal layer, wherein gates for the electronic devices are located on the second metal layer, wherein the first metal layer is located below the second metal layer and it is necessary to remove the second metal layer in order to test the level of the outputs.

These and other features and objects of the invention will be more fully understood from the following detailed description of the embodiments, which should be read in light of the accompanying drawings.

In this regard, before explaining at least one embodiment of the invention in detail, it is to be understood that the invention is not limited in its application to the details of construction and to the arrangements of the components set forth in the description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be used as a basis for designing other structures, methods, and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The accompanying drawings, which are incorporated in and form a part of the specification, illustrate embodiments of the present invention and, together with the description, serve to explain the principles of the invention.

DETAILED DESCRIPTION OF THE DRAWINGS

Many semiconductor processes that contain logic functions provide different types of MOS devices to be used in different environments. For example, one device can operate only at lower voltages and can be sized to minimum geometry. Another device can operate at higher voltages and cannot be sized to minimum geometry. Using this type of device allows the semiconductor device to interface to external signals that are higher in voltage when compared to the internal minimum sized devices.

The type of MOS device in the previous example is typically controlled by the electrical characteristics of the diffusion material. These characteristics are changed by slightly altering the atomic structure of this material by using an ion implant dose and energy. This process is normally described as "doping". This slight change of electrical properties cannot be detected by the conventional reverse engineering teardown techniques.

In order to provide a device that is resistant to these reverse engineering techniques, an invisible bias generator (IBG) has been developed. An IBG is defined as an electronic device having at least two internal devices where the physical geometries of the internal devices cannot be used to determine the operating characteristics of the IBG.

One example of an IBG is a device where both internal devices have the same geometry but operate differently. For example, the first device may be a transistor that operates at a first voltage level and the second device is a transistor that operates at a different voltage level. In another example, the first device is a silicide resistor while the second device is a non-silicide resistor. In another example, conductive ink is used to create an electronic circuit and the amount of conductive material in the ink is changed between two of the elements.

Another example of an IBG is a device where both internal devices having different geometries but have the same operating characteristics. For example, the first device may be a transistor that operates with first characteristics and the second device is larger a transistor that operates with the same characteristics. In another example, the first device is a silicided resistor while the second device is a non-silicide resistor. In another example, conductive ink is used to create an electronic circuit and the amount of conductive material in the ink is changed between two of the elements.

Figure 1:
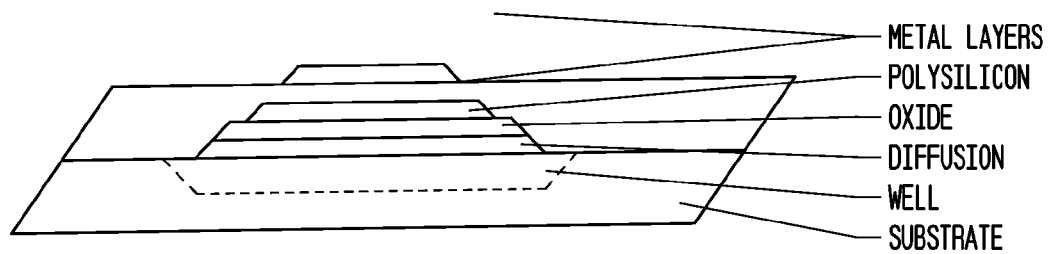
FIG. 1 illustrates semiconductor layers and regions that are imaged by the teardown reverse engineering technique.
Figure 2:
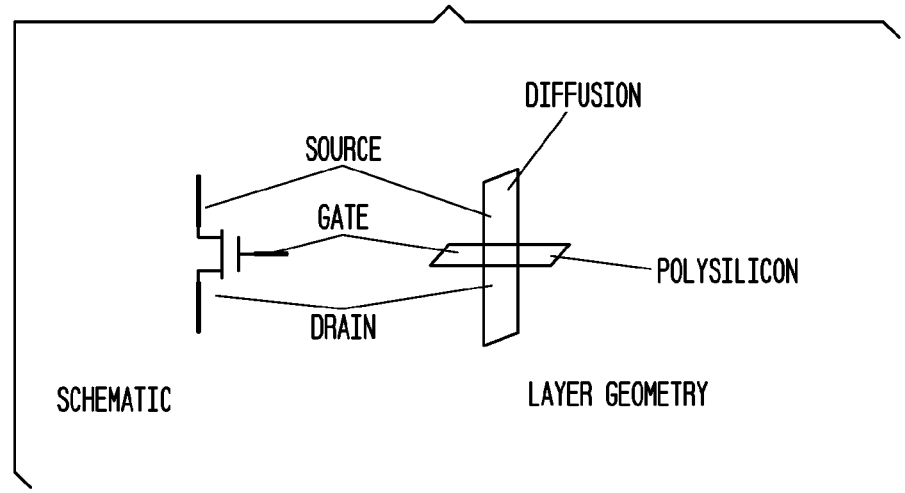
FIG. 2 illustrates how the semiconductor layers define the MOS device.
Figure 3:
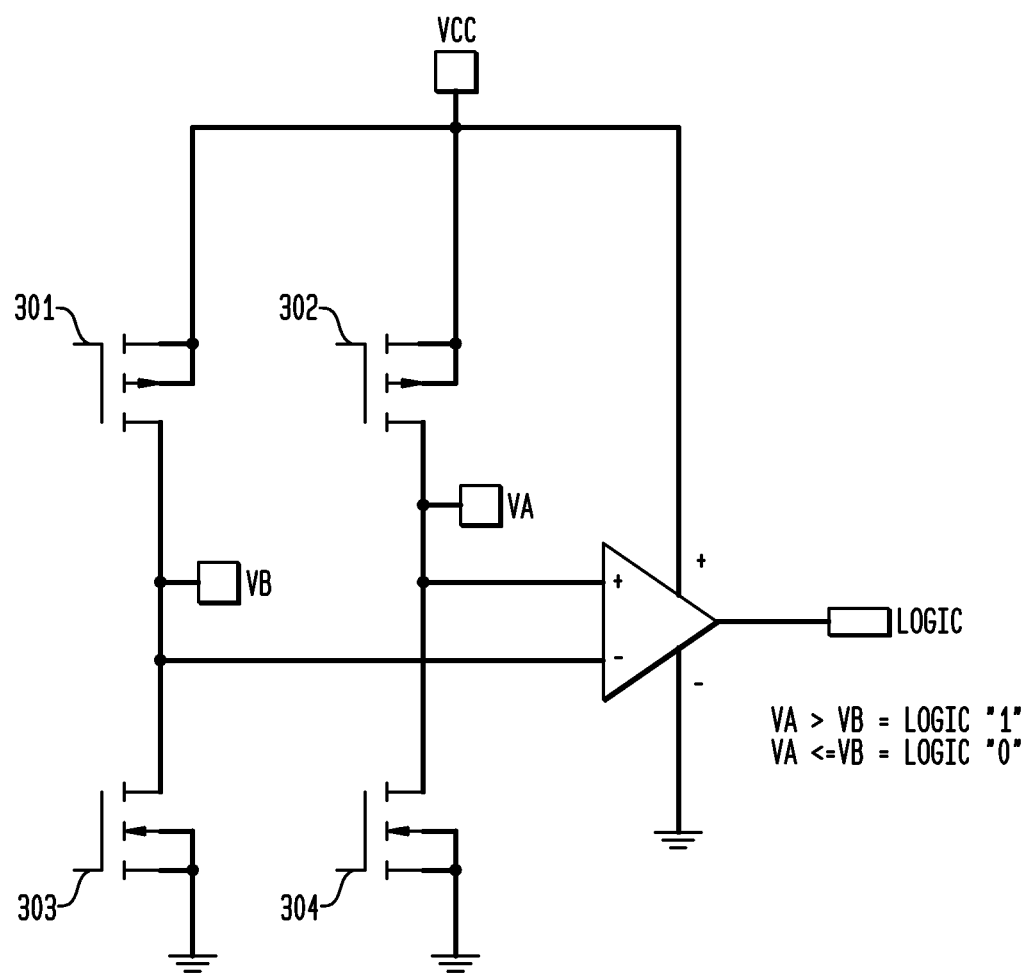
FIG. 3 illustrates a circuit that is resistive to conventional reverse engineering techniques.

FIG. 3 illustrates a circuit that provides an effective deterrent to semiconductor device teardown techniques. The circuit depends on the electrical differences due to slight doping changes while maintaining identical device geometry. The gates on the P channel devices 301, 302 are charged via leakage to VCC while the gates on the N channel devices 303, 304 are charged via leakage to GND. The depth of the conduction channel is determined by the doping levels of the diffusion area which in turn determines the voltage level on the P and N channel device junction, labeled VA and VB in FIG. 3. The difference in voltage bias levels is used as the criteria for determining whether this device has a logic output of "1" or "0". VA and VB can be any voltage level as the logic criteria is based on the difference of these voltages. Because the circuit of FIG. 3 contains identical geometry for the P and N channel devices, the only difference in performance is due to the doping level difference between the high voltage (3.3V) and the low voltage (2.5V) device. The logic function of this circuit is invisible to reverse engineering teardown techniques. This circuit is an example of an IBG.

An advantage of the IBG circuit is that it can be easily constructed with current methods. Also, the IBG circuit can be used to create a number of different of logic cells by varying the number of high voltage devices and low voltage devices.

Figure 4:
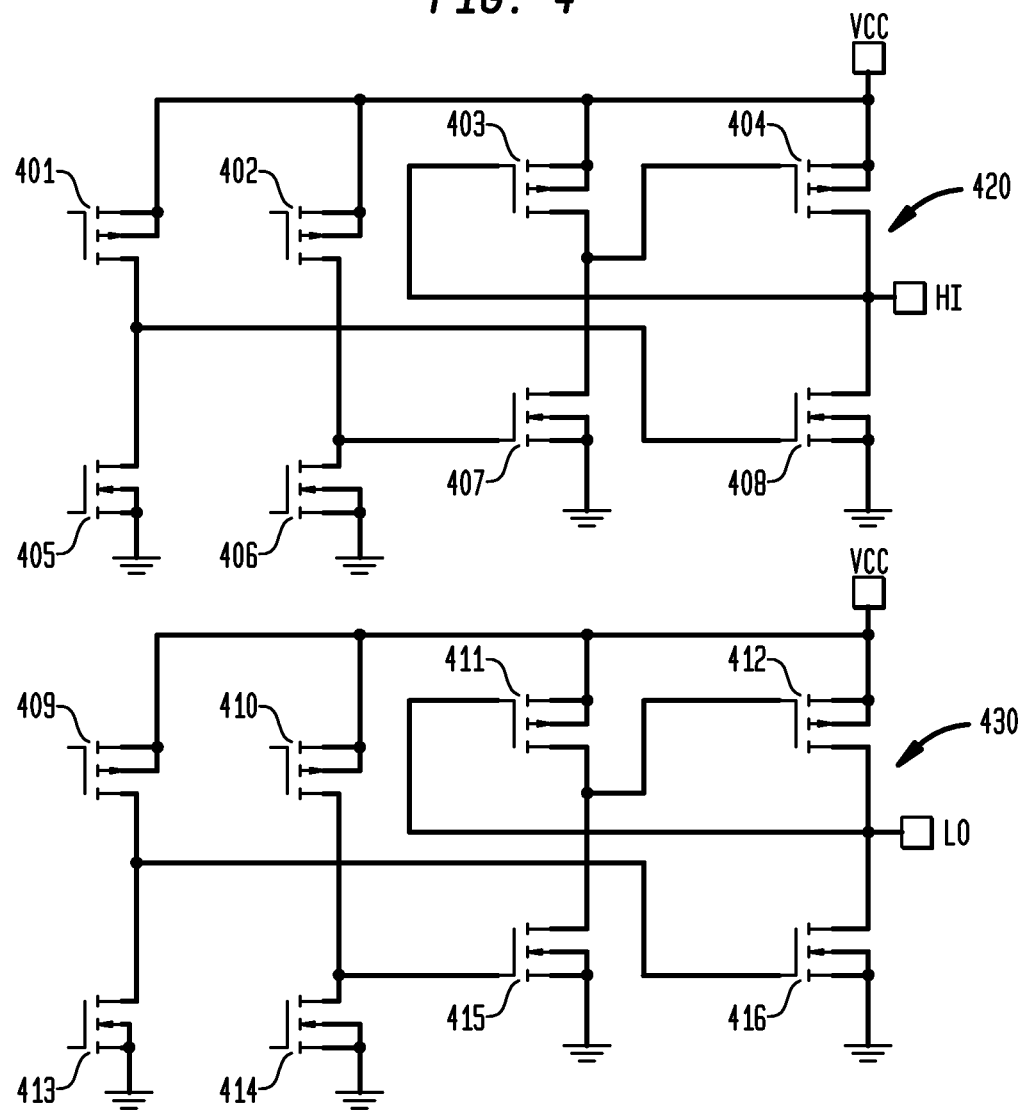
FIG. 4 illustrates a circuit configuration using a comparator.

There are numerous configurations of IBG circuits. FIG. 4 illustrates a circuit configuration using a comparator. In this configuration, the generated voltage levels are insufficient to directly interface with digital logic. Therefore, a comparator is used to determine the difference between the high voltage and the low voltage.

FIG. 4 illustrates an embodiment where there are 16 transistor devices (401 through 416). Each of the transistors can be a P-type or a N-type device. Also each device can be a high voltage device or a low voltage device. In a preferred embodiment, a high voltage device operates at 3.3 V while a low voltage device operates at 2.5 V. In an exemplary embodiment, transistors 402, 403, 404, 409, 411, and 412 are low voltage P-type devices. Transistor 401 and 410 are high voltage P-type devices. Transistors 405, 407, 408, 414, 415, and 416 are low voltage N-type devices. Transistors 406 and 413 are high voltage N-type devices. Device 420 gives the "HI" voltage output while device 430 gives the "LO" voltage output. The "HI" output is compared to the "LO" output to determine if a binary "1" or "0" is the output. The geometry and size of device 420 is identical to the geometry and size of device 430. The only discernable difference between the two devices is the level of doping between the high voltage transistors and the low voltage transistors. Because the size and the geometry of device 420 is identical to that of device 430 it is not possible to determine the difference between these two devices using the conventional reverse engineering teardown techniques.

Figure 5:
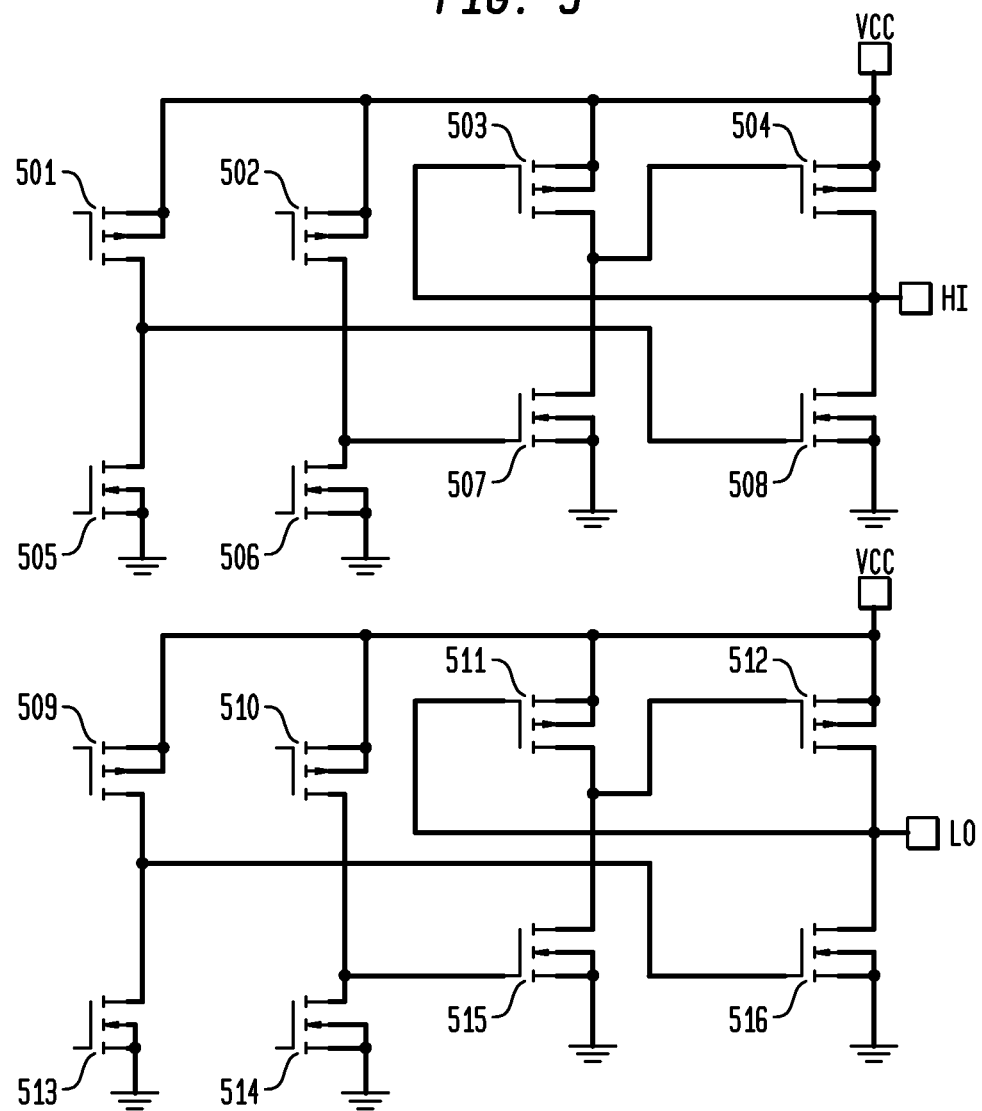
FIG. 5 illustrates a second configuration using a comparator.

FIG. 5 illustrates a second embodiment of an IBG using a comparator to determine the logic level of the device. Similar to the embodiment shown in FIG. 4, there are 16 transistor devices (501 through 516). Each of the transistors can be a P-type or a N-type device. Also each device can be a high voltage device or a low voltage device. In a preferred embodiment, a high voltage device operates at 3.3 V while a low voltage device operates at 2.5 V. In an exemplary embodiment, transistors 502, 503, 504, 509, 511, and 512 are low voltage P-type devices. Transistor 501 and 510 are high voltage P-type devices. Transistors 505, 507, 508, 514, 515, and 516 are low voltage N-type devices. Transistors 506 and 513 are high voltage N-type devices. Device 520 gives the "HI" voltage output while device 530 gives the "LO" voltage output. The "HI" output is compared to the "LO" output to determine if a binary "1" or "0" is the output. The geometry and size of device 520 is identical to the geometry and size of device 530. The only discernable difference between the two devices is the level of doping between the high voltage transistors and the low voltage transistors. Because the size and the geometry of device 520 is identical to that of device 530 it is not possible to determine the difference between these two devices using the conventional reverse engineering teardown techniques.

If a semiconductor chip contains an IBG as described in FIG. 4 or FIG. 5, it is extremely difficult for someone trying to reverse engineer the chip using teardown techniques to determine the function of the IBG devices placed on the chip because the geometry of the internal devices are the same.

Figure 6:
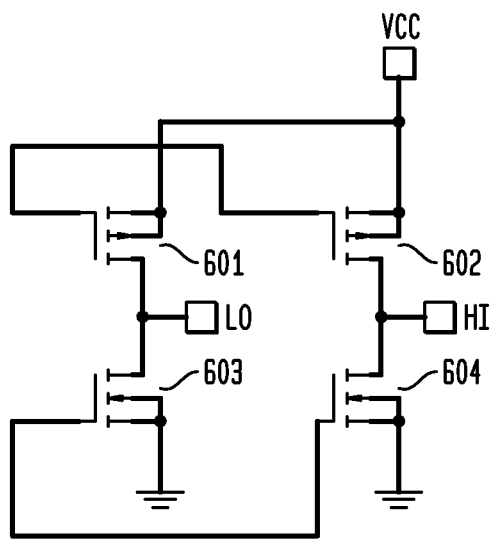
FIG. 6 illustrates a circuit configuration without a comparator.
Figure 7:
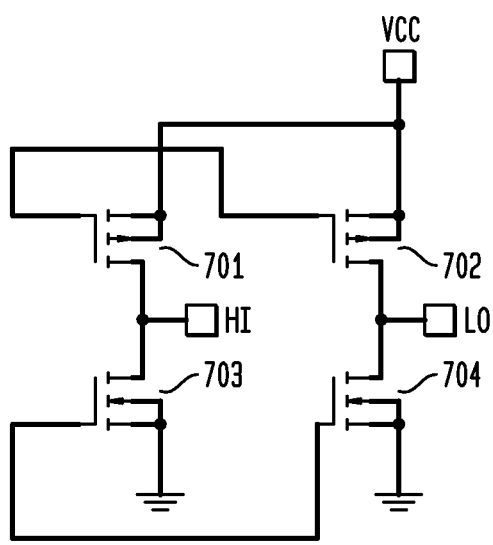
FIG. 7 illustrates a second circuit configuration without a comparator.

FIG. 6 and FIG. 7 illustrate examples of IBGs where the voltage levels are sufficient to directly interface with the devices on a chip. In FIG. 6, device 601 is a high voltage P-type device, device 602 is a low voltage P-type device, device 603 is a low voltage N-type device and 604 is a high voltage N-type device. The output of the LO is compared to the output of the HI to determine if a logic "1" or logic "0" is output.

In FIG. 7, device 701 is a high voltage P-type device, device 702 is a low voltage P-type device, device 704 is a low voltage N-type device and 703 is a high voltage N-type device. The output of the LO is compared to the output of the HI to determine if a logic "1" or logic "0" is output.

The IBG shown in FIG. 6 has the same geometry as the IBG shown in FIG. 7 with the only difference being the doping level of some of the transistors. Therefore, if a chip is designed using the IBG illustrated in FIG. 6 and the IBG illustrated in FIG. 7, it is very difficult to determine a difference in the function of the devices made by each design.

The IBG shown in FIG. 6 can include different configurations. In one example, device 601 is a low voltage P-type device, device 602 is a high voltage P-type device, device 603 is a low voltage N-type device and 604 is a high voltage N-type device. In another example device 601 is a high voltage P-type device, device 602 is a low voltage P-type device, device 603 is a high voltage N-type device and 604 is a high voltage N-type device. In another example device 601 is a high voltage P-type device, device 602 is a low voltage P-type device, device 603 is a low voltage N-type device and 604 is a low voltage N-type device. In another example device 601 is a high voltage P-type device, device 602 is a low voltage P-type device, device 603 is a low voltage N-type device and 604 is a high voltage N-type device. There is a total of sixteen configurations possible for a four device IBG.

Figure 8:
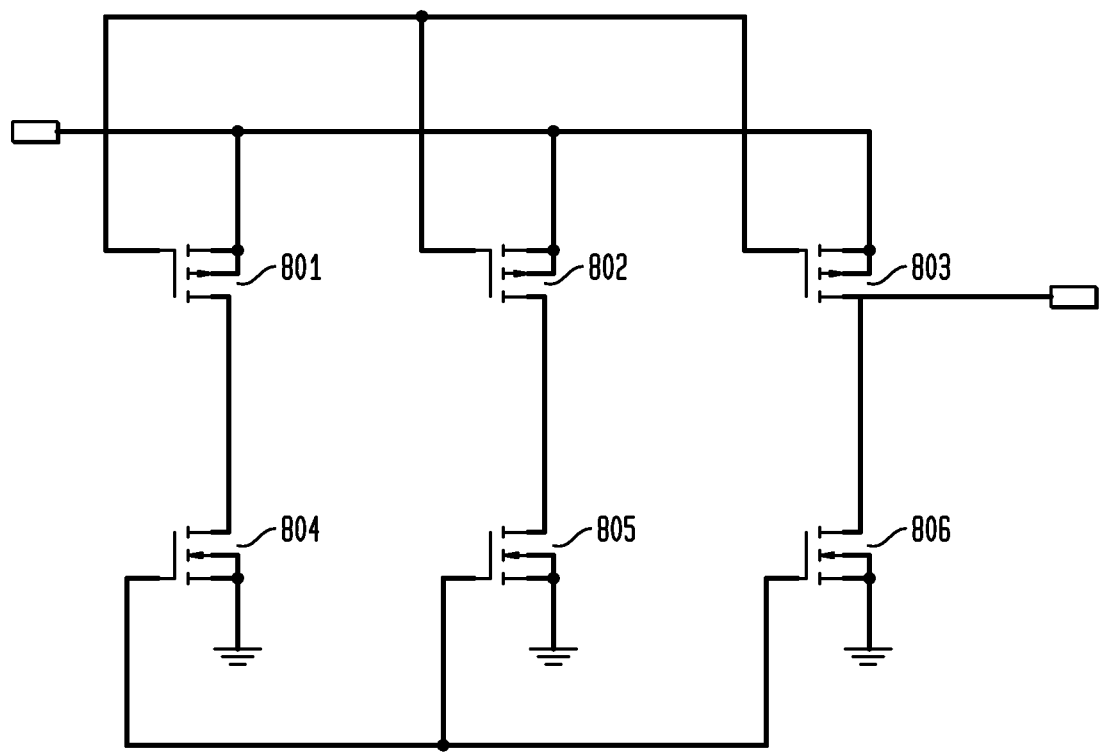
FIG. 8 illustrates an circuit configuration having six active devices.

FIG. 8 illustrates another embodiment of an IBG circuit. Devices 801, 802, 803 are shown as P-type devices and can be any combination of high voltage or low voltage devices. Devices 804, 805, 806 are shown as N-type devices and can be any combination of high voltage or low voltage devices. However, the six devices shown can be any combination of P-type and N-type devices. The six device IBG has a total of 64 possible configurations. Furthermore, an IBG can be comprised of any number of active devices with 2 to the "n" number of combinations, where n is the number of active devices.

Figure 9A:
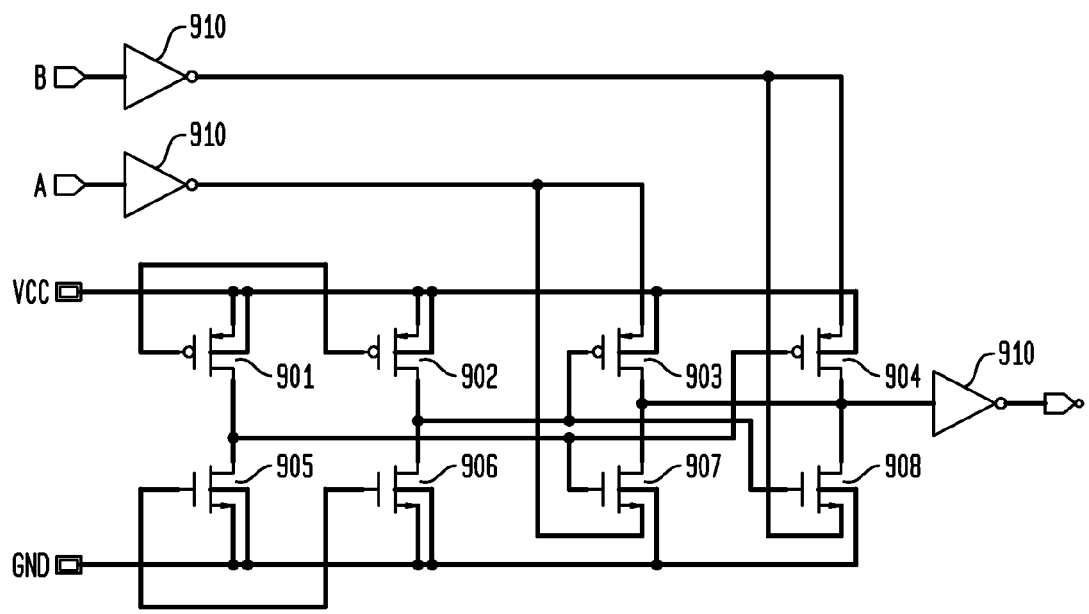
FIG. 9A illustrates a multiplexer using the disclosed techniques.
Figure 9B:
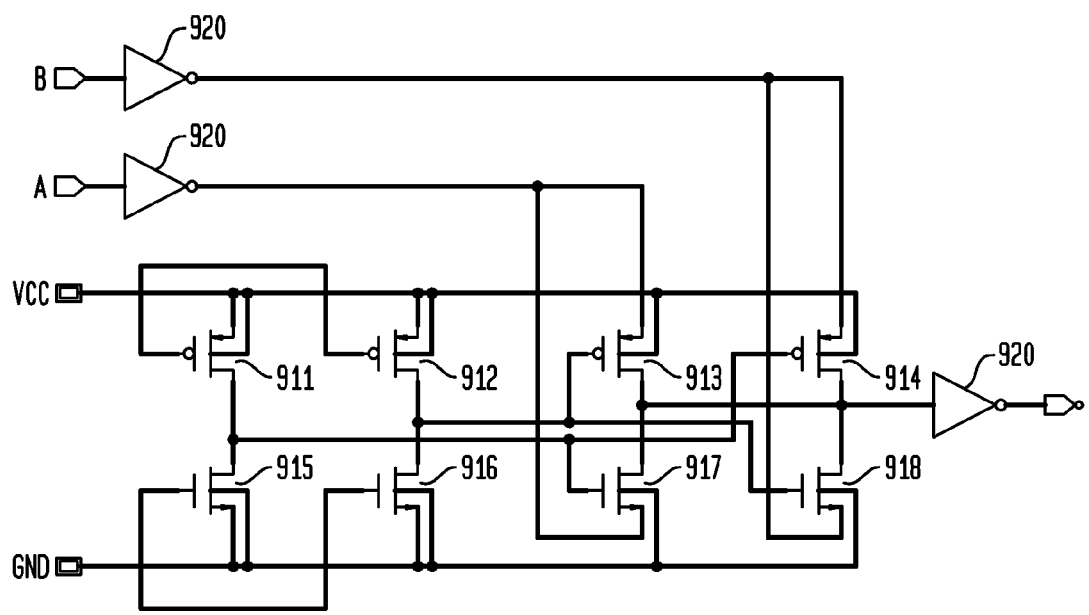
FIG. 9B illustrates a second embodiment of a multiplexer using the disclosed techniques.

FIG. 9A and FIG. 9B illustrate IBG based multiplexers. Because IBG circuits may be used to select logic functions, it is convenient to implement these circuits built into digital multiplexers that effectively steer one of two inputs to its output. These IBG based multiplexers select an input base solely on the IBG function. The multiplexer shown in FIG. 9A selects the B input while the multiplexer shown in FIG. 9B selects the A input. The only difference between these circuits is the configuration of 3.3V and 2.5V devices. In FIG. 9A, devices 901 and 906 are 3.3V devices while devices 902, 903, 904, 905, 907, and 908 are 2.5V devices. Inverter 910 provides the inverse of input A and the inverse of input B. In FIG. 9B, devices 912 and 915 are 3.3V devices while devices 911, 913, 914, 916, 917, and 918 are 2.5V devices. Inverter 920 provides the inverse of input A and the inverse of input B.

Figure 10:
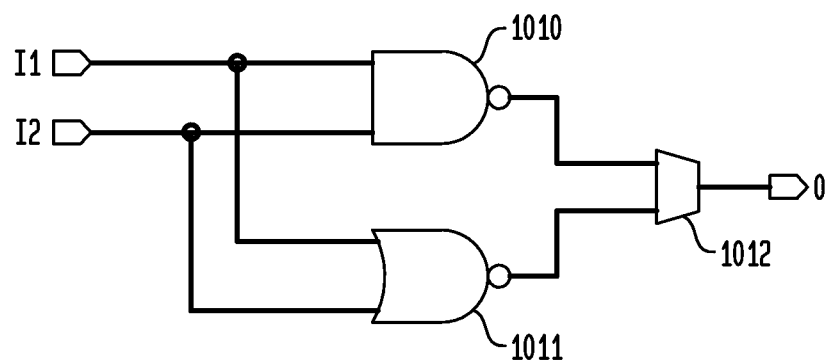
FIG. 10 illustrates the implementation of a "NAND" logic function.
Figure 11:
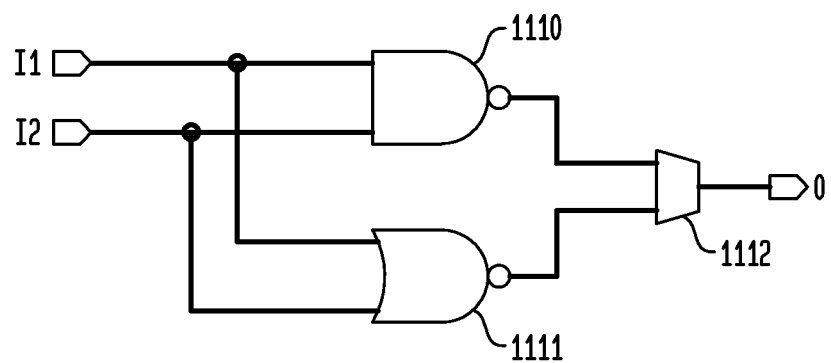
FIG. 11 illustrates the implementation of a "NOR" logic function.

FIG. 10 represents the implementation of a "NAND" logic function and FIG. 11 illustrates the implementation of a "NOR" logic function. In FIG. 10, NAND 1010 and NOR 1011 output to MUX 1012. In FIG. 11, NAND 1110 and NOR 1111 output to MUX 1112. These two implementations appear to identical during reverse engineering because the difference between these configurations is the IBG circuit. Without knowledge of the IBG circuit the logic function of these configurations is indeterminate.

Figure 12:
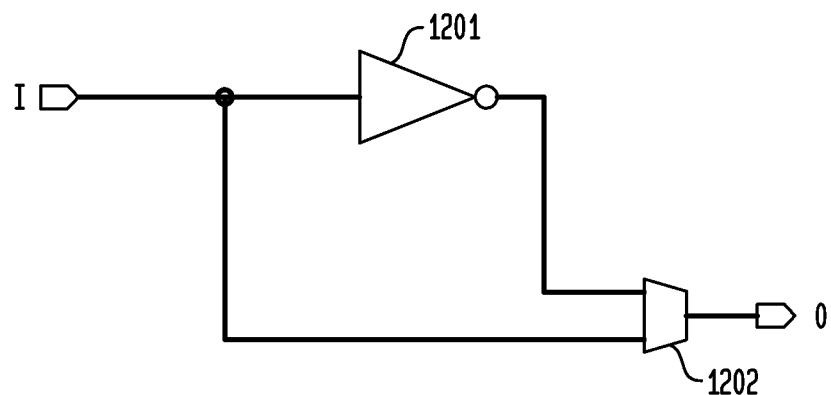
FIG. 12 illustrates the implementation of a "INVERT" logic function.
Figure 13:
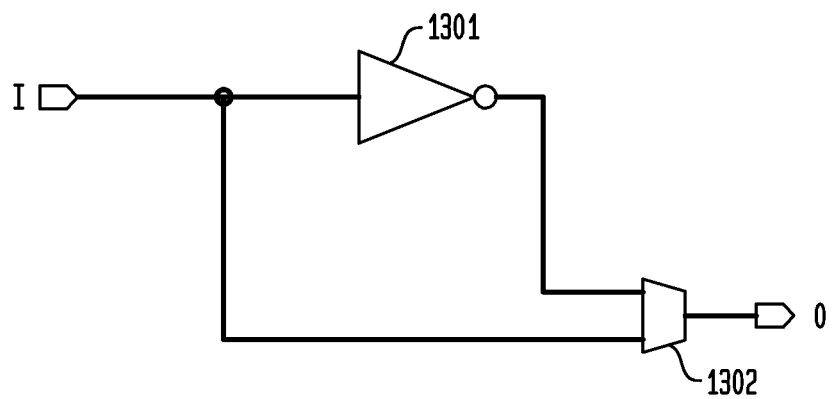
FIG. 13 illustrates the implementation of a "BUFFER" logic function.
Figure 14:
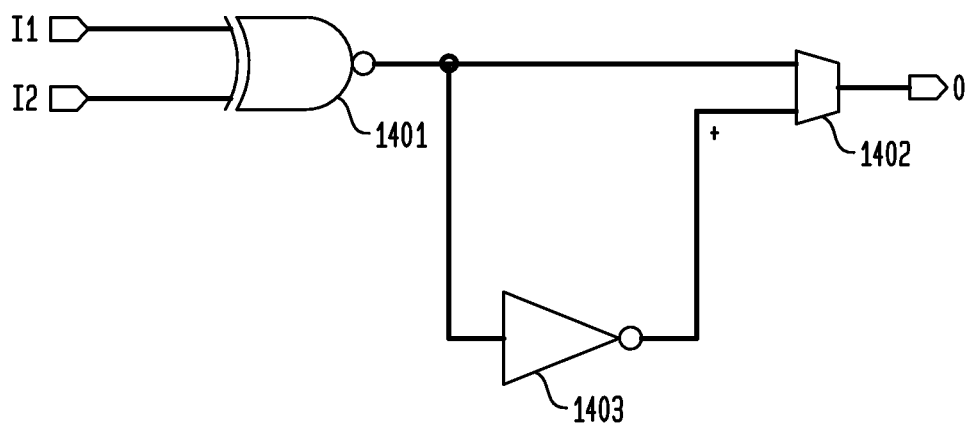
FIG. 14 illustrates the implementation of a "XOR" logic function.
Figure 15:
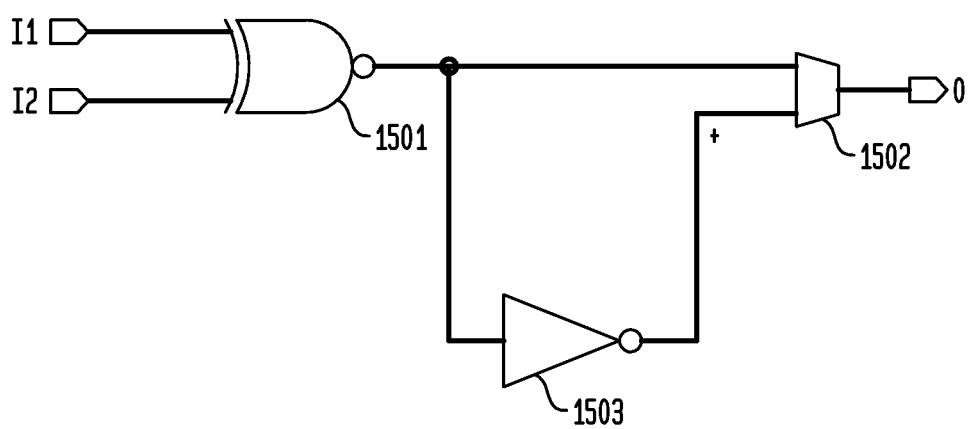
FIG. 15 illustrates the implementation of a "XNOR" logic function.

FIG. 12 illustrates an implementation of the logic function "INVERT". FIG. 13 illustrates an implementation of the logic function "BUFFER". FIG. 14 illustrates an implementation of the logic function "XOR". FIG. 15 illustrates an implementation of the logic function "XNOR". As with the previous examples, reverse engineering a chip that has both the "INVERT" of FIG. 12 and the "BUFFER" of FIG. 13 will be difficult to perform because the "INVERT" and the "BUFFER" will have the same appearance. Reverse engineering a chip that has both the "XOR" of FIG. 14 and the "XNOR" of FIG. 15 is difficult because the "XOR" and "XNOR" have the same appearance. Each pair of implementations is indeterminate without knowledge of the IBG circuit.

One advantage of the high voltage/low voltage method of anti-reverse engineering deterrent is that most processes support this distinction. Many implementations are designed to use low voltages internal voltages because as feature size decreases the internal voltage decreases. But, many devices outside of the chip operate at higher voltages and the chips must be able to interface with these devices. Therefore, devices that use higher voltages are still used and being developed. It is possible to for the difference between the low voltage device and the high voltage device to be achieved using small doping changes between P and N devices.

The IBG devices described above include active devices that use the dopant level to control characteristics of the devices. As an example, it is known in a particular process that a doping concentration difference between the 2.5V and 3.3V devices is about 8×E16 atoms/cm3. Structures that have doping density differences below 1×E17 are candidates for IBG design. Examples of IBGs are in FIG. 16.

There are many other combinations of devices that will work besides the 2.5V and 3.3V devices. For example, a 2.5V can be used with a 5V device. A 1.8V device, a 1.5V device, or a 1.2V can be used with a 3.3V device. A 1.2V device can be used with 1.8V or a 2.5V device. A 1.0V device can be used with a 1.8V device, 2.5V device, or a 3.3V device. A 0.85V device can be used with a 1.8V device, a 2.5V device, or a 3.3V device. This list is exemplary only and any combination of devices that can be made with the same physical geometry can be used.

Figure 16A:
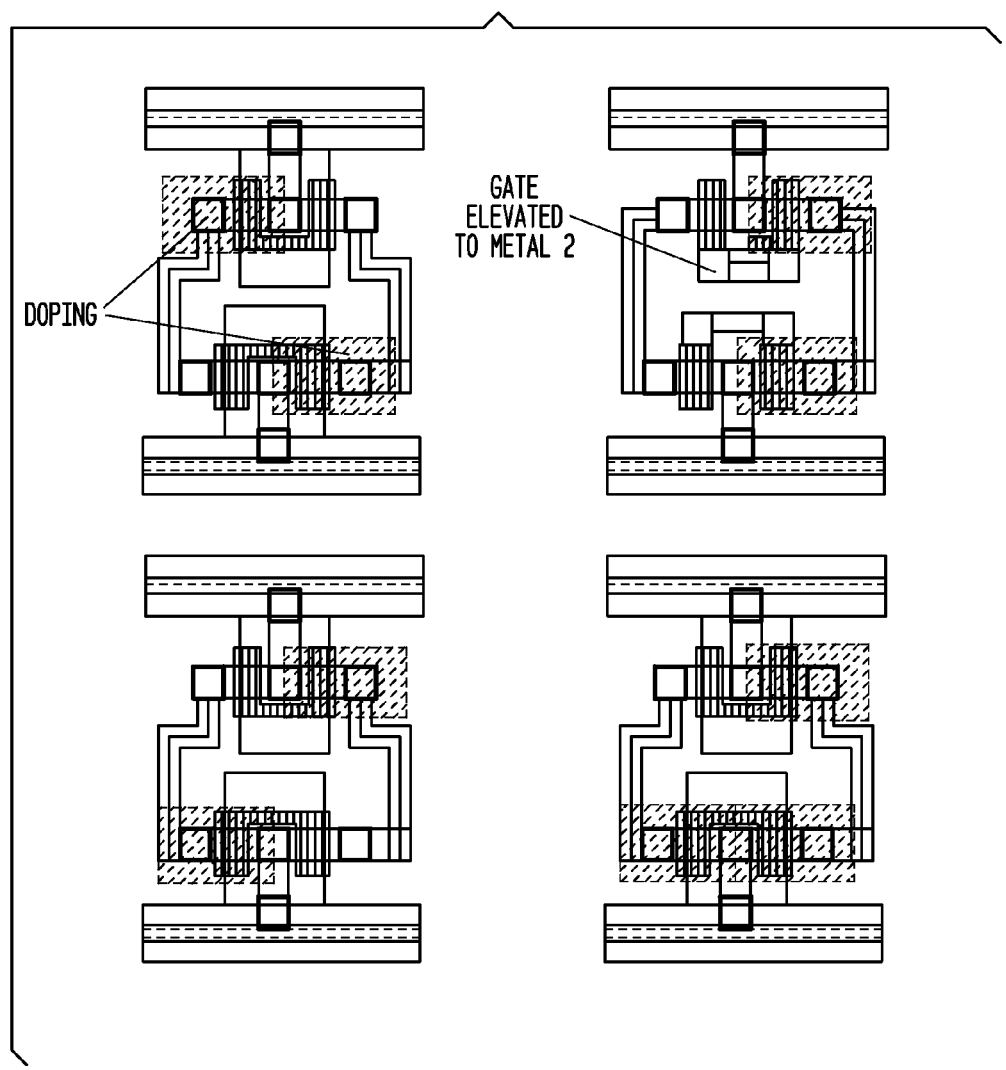
FIG. 16A illustrates an IBG device having active components.
Figure 16B:
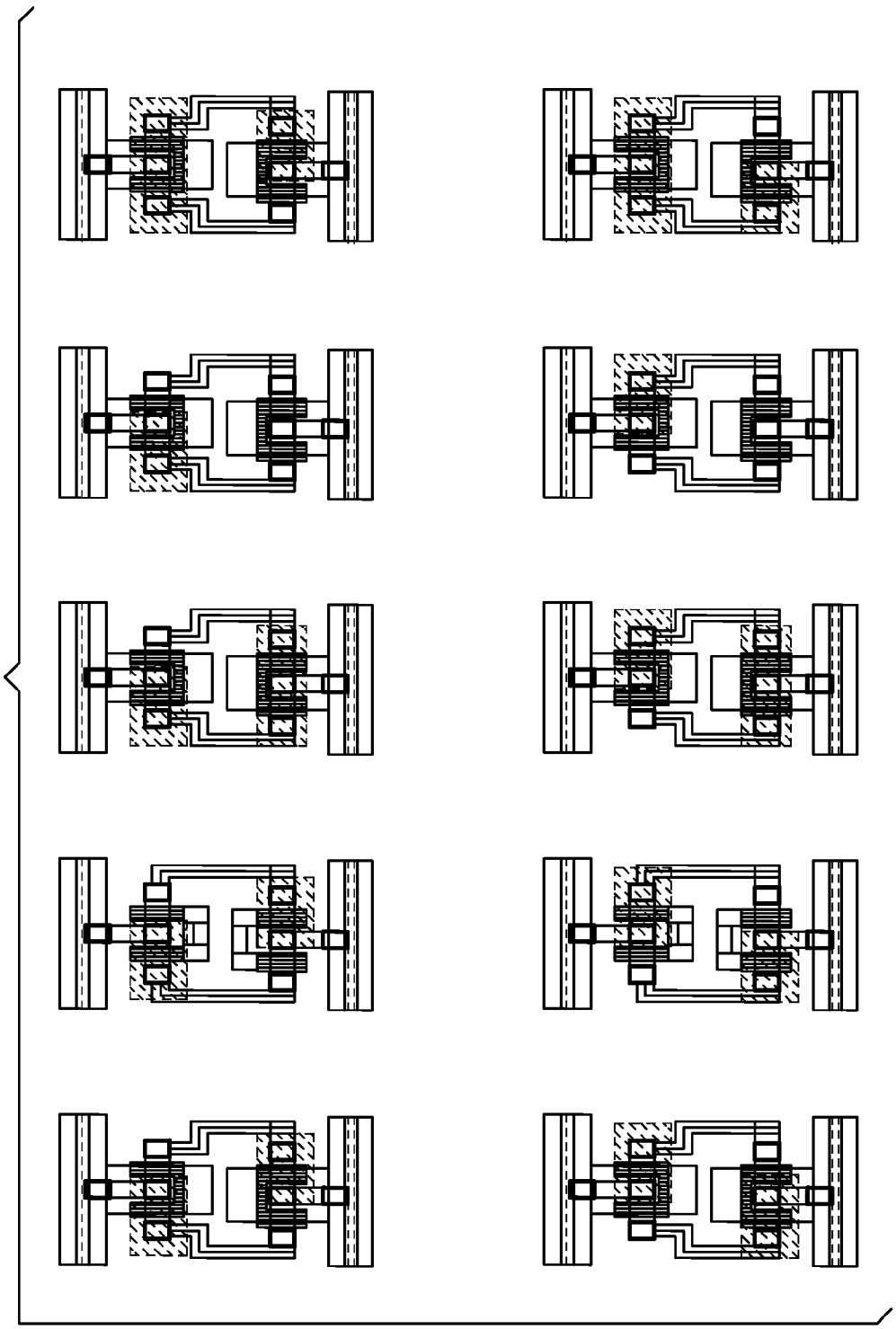
FIG. 16B illustrates alternative embodiments of IBG devices having active components.

The previous examples illustrate some of the possible implementations of IBG devices using active devices. Another way to achieve an IBG device is to use inactive devices. The IBG can be made using a silicide poly resistor and a non-silicide poly resistor. The first device is used to set the first bias voltage as an active bias voltage and the second device is used to set the set the second bias voltage as an active bias voltage. The difference between the silicide poly resistor and the non-silicide poly resistor will not be apparent to the conventional reverse engineering techniques because the resistors have the same geometry. FIG. 16A illustrates an example of an IBG device. FIG. 16B illustrates other examples of an IBG device.

Polysilicon has fairly high resistivity, about a few hundred μΩ-cm. Resistive devices from polysilicon suffer from this high resistivity because as the device dimension shrinks, the resistance of the polysilicon local interconnection increases. This increased resistance causes an increase in the power consumption and a longer RC time delay. Silicides are added to polysilicon devices because the addition of the silicides reduces the resistance and increases device speed. Any silicide that has a much lower resistivity than polysilicon may be used. Titanium silicide ($TiSi_2$) and tungsten silicide ($WSi_2$) are two silicides that are commonly used.

Next, one method of forming a silicide device is described. A self-aligned silicide process is conventionally used to from Titanium Silicide. Initially, chemical solutions are used to clean the wafer surface in order to remove contaminants and particles. Next, the wafer is sputtered in a vacuum chamber using argon to remove the native oxide from the wafer surface. Next, a layer of the wafer surface is sputtered to deposit a layer of titanium on the wafer surface. This results in a wafer having the silicon exposed at the source/drain and on top of the polysilicon gate. Next, a titanium silicide is formed on the polysilicon by using a thermal annealing process. For example, annealing can be performed in a rapid thermal process to form titanium silicide on top of the polysilicon and on the surface of the source/drain. Because titanium does not react with silicon dioxide, silicide is formed only where polysilicon directly contacts with titanium. Next, the unreacted titanium is removed by using a wet etch process that exposes the unreacted titanium to a mixture of hydrogen peroxide ($H_2O_2$) and sulfuric acid ($H_2SO_4$). Lastly, the wafer is annealed which increases the grain size of the titanium Silicide. The increased grain size improves the wafer's conductivity and reduces wafer's contact resistance.

Another characteristic that can be controlled in the IBG device is the threshold voltage. The threshold of MOS transistors can be controlled by threshold adjustment implant. An ion implantation process is used to ensure that the power supply voltage of the electronic systems can turn the MOS transistor in the IC chip on and off. The threshold adjustment implantation is a low-energy and low current implantation process. Typically, the threshold adjustment implantation is performed before gate oxide growth. For CMOS IC chips, two threshold adjustment implantation processes are needed, one for p-type and one for n-type.

In an IBG device, the process described above can be used to produce resistors that have the same physical dimensions and have different resistance. Conversely, the process can be used to produce resistors that have different geometries and the same resistance.

Figure 17:
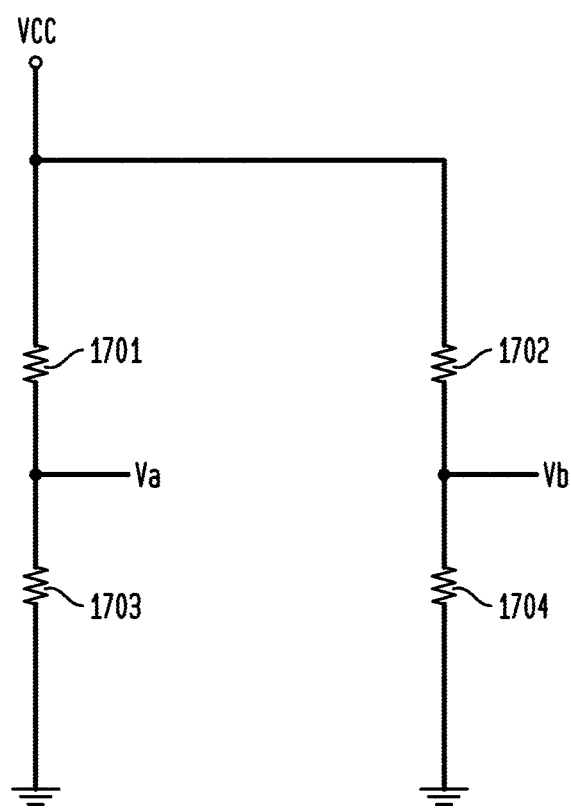
FIG. 17 illustrates a circuit comprised of resistors.

FIG. 17 illustrates an example of an IBG device implemented by silicide resistors. A voltage source VCC is connected to a circuit having resistors 1701, 1702, 1703, 1704. The resistance of the resistors can be set by the method described above to have two different resistance levels with all of the resistors having the same physical geometry. For example, resistors 1701 and 1704 may be non-silicide resistors while resistors 1702 and 1703 are silicide resistors. In this example if Va is less than Vb then the output of the device is a logic "1." If Va is greater than or equal to Vb then the output of the device is a logic "0."

In another embodiment, the devices can be formed using conductive inks. Conductive inks are used to print circuits on a variety of substrate materials. Conductive inks contain conductive materials such as powdered or flaked silver materials.

Conductive inks can be used to implement IBG circuits because the properties of the inks used to print the circuit can be varied to create devices that have different properties. For example, some devices can be printed using conductive ink having an amount of conductive material. Then, conductive ink that has more (or less) conductive material is used to print another portion of the circuit. The circuit then can have devices that look similar and operate differently or look different and operate the same.

One possible method of reverse engineering IBG circuits is to physically measure the devices in the circuit. This can be done using a probe to measure the actual voltage generated by the circuit. In order to thwart this method of reverse engineering, the IBG cells are placed randomly spaced throughout the design. This makes it more difficult to probe the large number of IBG circuits required to reverse engineer the design.

In an alternative embodiment, the types of IBG circuits used are randomly distributed. For example, every third "AND" gate is implemented using an IBG circuit while every fourth "NAND" gate is implemented using an IBG circuit. As the number of devices implemented by IBG circuits is increased, the difficulty in reverse engineering the chip is increased. Additionally, as the number of types of logic devices implemented by IBG is increased, the difficulty in reverse engineering the chip is increased.

In another embodiment, logic blocks are made having logic devices therein. Within each logic block, the IBGs are randomly distributed within the logic block. As a result, different types of logic devices within each logic block are comprised of IBG devices.

In another embodiment, logic blocks are made having logic devices. The designer determines for the logic blocks a critical point and uses an IBG to implement the critical point. The critical point is a point within the logic the block where it is necessary to know the function or output value in order to determine the function of the logic block. Implementing the critical point within the logic block by an IBG is advantageous because this ensures that IBG has maximum effect in preventing reverse engineering. The inability to determine the value of critical point will necessarily prevent the reverse engineer from determining the proper function for the logic block.

For example, if the logic block is an ADDER, replacing a digit in the output can make it impossible to determine the function of the adder. That is because someone trying to reverse engineer the chip monitoring the function of the logic block would expect a specific output for an ADDER. When the replaced digit does not give the expected result, it is not determined that the logic block is functioning as and ADDER.

Another advantage of the disclosed system and method is that chip can be designed using standard tools and techniques. Methods of designing a chip are described in the following paragraphs.

A designer creates an overall design for the chip and for logic blocks within the chip. The design is created in a known hardware design language such as Verilog or VHDL. The design is then synthesized into standard logic which converts the design to the optimized gate level. Synthesis may be performed using standard synthesis tools such as Talus Design, Encounter RTL Designer, and Design Compiler. The synthesis maps the logic blocks into standard logic using a standard cell library provided by the supplier. Next, a place and route tool is used to create a physical implementation of the design. This step involves creating a floorplan, a power grid, placing the standard cells, implementing a clock tree, and routing connectivity between cells and input/output pins. Some examples of place and route tools are Talus Vortex, Encounter Digital Implementation, and IC Compiler. Using this process there are various ways to design a chip using IBG devices. One way is to create and characterize one or more new standard cell libraries and use the one or more new standard cells at the beginning of the process. Another approach is to place the IBG devices during the place and route step, either automatically or manually.

Another method of designing a chip is for the designer to create the design using a schematic entry tool. The designer creates a circuit by hand comprising the base logic gates. The designer can optimize the logic functionality using Karnaugh-maps. A layout entry tool is used to create the physical implementation of the design. The designer draws polygons to represent actual layers that are implemented in silicon. Using this approach the designer places IBG devices at any desired location.

Another advantage of the disclosed system and method is that it can be implemented in any type of electronic device. For example, a read-only memory (ROM) can be implemented with the techniques described above and the contents of the memory are protected by the physical implementation of the IBG circuit. This enables a protected memory device without the need for complicated encryption techniques. Additionally, microprocessors or any other electronic circuit can designed using one or IBG in the implementation.

Because the above devices result in a design that is difficult to reverse engineer using the conventional tear down techniques, another method may be implemented to reverse engineer the chip. Another known method of reverse engineering is to probe the device while active in order to establish the operating values of the internal devices. In order to perform these methods, the reverse engineer must remove some layers of the wafer to expose the output contacts of the devices. One way to make this technique more difficult is to randomly place the logic devices as described above. Another technique is to design a chip that is physically resistant to these techniques.

Figure 18:
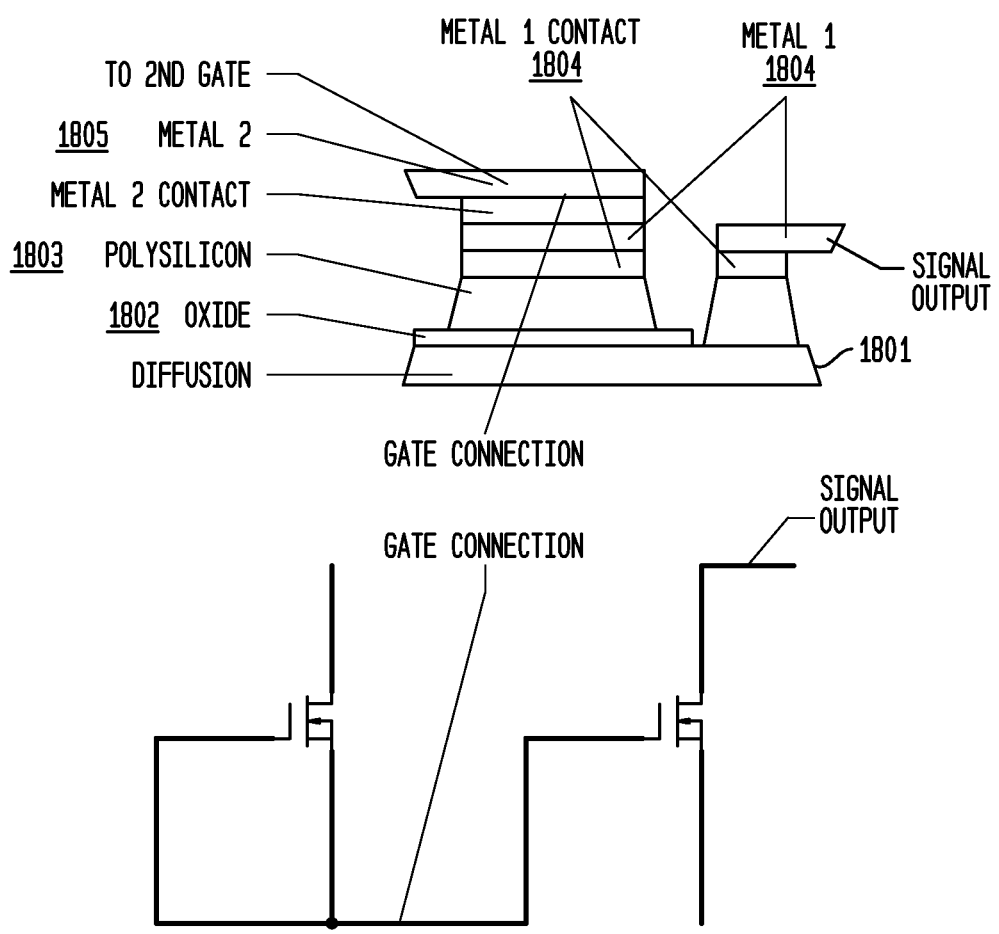
FIG. 18 illustrates a side view of a silicon wafer having active devices.

FIG. 18 illustrates a silicon wafer that is resistant to electronic testing of the chip. has this feature. FIG. 18 shows layers of the wafer. The wafer has a base layer 1801 that includes the diffusion layer. The oxide layer 1802 is on top of the diffusion layer 1801. The polysilicon layer 1803 is located on top of the oxide layer with the metal layer 1 1804 located thereon. The signal outputs are formed in metal layer 1 1804. Metal layer 2 1805 is located on top of the metal layer 1 1804. The gate connections are formed in metal layer 2 1805. With this layout it is necessary to remove a portion of metal layer 2 1805 in order to probe the signal outputs that are located in metal layer 1 1804. Removing a portion of metal layer 2 1805 disrupts the gate connections of the devices which in turn deactivates the devices. Thus, a reverse engineer trying to probe the device will destroy the functionally of the device during the reverse engineering process.

In many of the techniques described above, the output voltage level of a device is used to determine the operation of the device. But, any other operating characteristic of the device could be used. For example, the rise time of the device, the current drawn, or the operating temperature can be used in the IBG. Also, more than one physical property of the device can be varied. For example, the geometry and the doping level can be controlled to implement an IBG.

The many features and advantages of the invention are apparent from the detailed specification. Thus, the appended claims are intended to cover all such features and advantages of the invention which fall within the true spirits and scope of the invention. Further, since numerous modifications and variations will readily occur to those skilled in the art, it is not desired to limit the invention to the exact construction and operation illustrated and described. Accordingly, all appropriate modifications and equivalents may be included within the scope of the invention.

Although this invention has been illustrated by reference to specific embodiments, it will be apparent to those skilled in the art that various changes and modifications may be made which clearly fall within the scope of the invention. The invention is intended to be protected broadly within the spirit and scope of the appended claims.

What is claimed is:

1. An electronic circuit comprising:
    a plurality of logic devices implementing logic functions, wherein at least one logic device implementing a logic function comprises an invisible bias generator having a first floating gate device having a first geometry and a first bias voltage, and a second floating gate device having a second geometry and a second bias voltage, wherein the first geometry and the second geometry are the same and the second bias voltage is different than the first bias voltage,
    wherein the first floating gate device includes a first doping level of a diffusion area and the second floating gate device includes a second doping level of a diffusion area, and wherein the first doping level is different than the second doping level.

2. The electronic circuit of claim 1, wherein two or more logic devices implementing logic functions are comprised of an invisible bias generators.

3. The electronic circuit of claim 1, wherein two or more types of logic devices implementing logic functions are comprised of an invisible bias generators.

4. The electronic circuit of claim 1, wherein the plurality of logic devices implementing logic functions comprise at least one of a NAND gate, an AND gate, an OR gate, a NOR gate, a XNOR, and an XOR gate.

* * * * *